US009997383B2

(12) United States Patent
Wasserman

(10) Patent No.: US 9,997,383 B2
(45) Date of Patent: Jun. 12, 2018

(54) BOND HEAD ASSEMBLIES, THERMOCOMPRESSION BONDING SYSTEMS AND METHODS OF ASSEMBLING AND OPERATING THE SAME

(71) Applicant: Kulicke and Soffa Industries, Inc., Fort Washington, PA (US)

(72) Inventor: Matthew B. Wasserman, Philadelphia, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 45 days.

(21) Appl. No.: 15/398,420

(22) Filed: Jan. 4, 2017

(65) Prior Publication Data

US 2017/0117168 A1  Apr. 27, 2017

(51) Int. Cl.
| | | |
|---|---|---|
| B23K 31/02 | (2006.01) |
| H01L 21/67 | (2006.01) |
| H01L 21/687 | (2006.01) |
| H01L 21/683 | (2006.01) |
| B23K 3/02 | (2006.01) |
| B23K 3/00 | (2006.01) |
| B23K 1/00 | (2006.01) |

(52) U.S. Cl.
CPC ...... *H01L 21/67092* (2013.01); *B23K 1/0016* (2013.01); *B23K 3/00* (2013.01); *B23K 3/027* (2013.01); *H01L 21/67103* (2013.01); *H01L 21/6838* (2013.01); *H01L 21/68728* (2013.01)

(58) Field of Classification Search
CPC ........... H01L 21/67092; H01L 21/6838; H01L 21/67103; H01L 21/68728
See application file for complete search history.

(56) References Cited

U.S. PATENT DOCUMENTS

| | | | |
|---|---|---|---|
| 4,224,494 A | 9/1980 | Reboux et al. | |
| 4,731,923 A | 3/1988 | Yagi et al. | |
| 4,768,702 A | 9/1988 | Takahashi et al. | |
| 4,804,810 A * | 2/1989 | Drummond | H01L 21/67132 219/85.19 |
| 4,851,648 A * | 7/1989 | Jacobs | B23K 3/0471 219/228 |
| 4,984,731 A * | 1/1991 | Imamura | H01L 21/67144 228/102 |
| 5,216,933 A | 6/1993 | Koji | |
| 5,368,217 A | 11/1994 | Simmons et al. | |
| 5,397,423 A | 3/1995 | Bantz et al. | |
| 5,549,240 A * | 8/1996 | Urban | B23K 1/018 228/19 |
| 6,494,359 B1 | 12/2002 | Hasegawa | |
| 6,821,381 B1 * | 11/2004 | Yamauchi | B23K 20/025 100/321 |
| 9,679,866 B2 * | 6/2017 | Wada | H01L 24/75 |

(Continued)

FOREIGN PATENT DOCUMENTS

JP        62024635 JP        2/1987

*Primary Examiner* — Kiley Stoner
(74) *Attorney, Agent, or Firm* — Christopher M. Spletzer, Sr.

(57) ABSTRACT

A bond head assembly for bonding a semiconductor element to a substrate is provided. The bond head assembly includes a base structure, a heater, and a clamping system securing the heater to the base structure. The clamping system includes a plurality of elastic elements constraining the heater along a plurality of axes.

26 Claims, 14 Drawing Sheets

(56) References Cited

U.S. PATENT DOCUMENTS

| | | | |
|---|---|---|---|
| 2002/0003137 A1 | 1/2002 | Yokoyama et al. | |
| 2004/0022037 A1* | 2/2004 | Higashi | H05K 13/04 |
| | | | 361/760 |
| 2006/0261491 A1 | 11/2006 | Soeta et al. | |
| 2009/0321500 A1* | 12/2009 | Okada | B23K 1/012 |
| | | | 228/119 |
| 2013/0181037 A1 | 7/2013 | Nagai et al. | |
| 2013/0292455 A1 | 11/2013 | Brofman et al. | |
| 2014/0027068 A1* | 1/2014 | Hung | H01L 24/75 |
| | | | 156/583.1 |
| 2014/0241843 A1 | 8/2014 | Golda et al. | |
| 2015/0171049 A1* | 6/2015 | Wasserman | H01L 24/75 |
| | | | 228/104 |
| 2016/0118363 A1* | 4/2016 | Wada | H01L 24/75 |
| | | | 219/521 |
| 2016/0254245 A1* | 9/2016 | Wasserman | H01L 24/75 |
| | | | 228/180.1 |
| 2017/0117168 A1* | 4/2017 | Wasserman | H01L 21/67092 |

\* cited by examiner

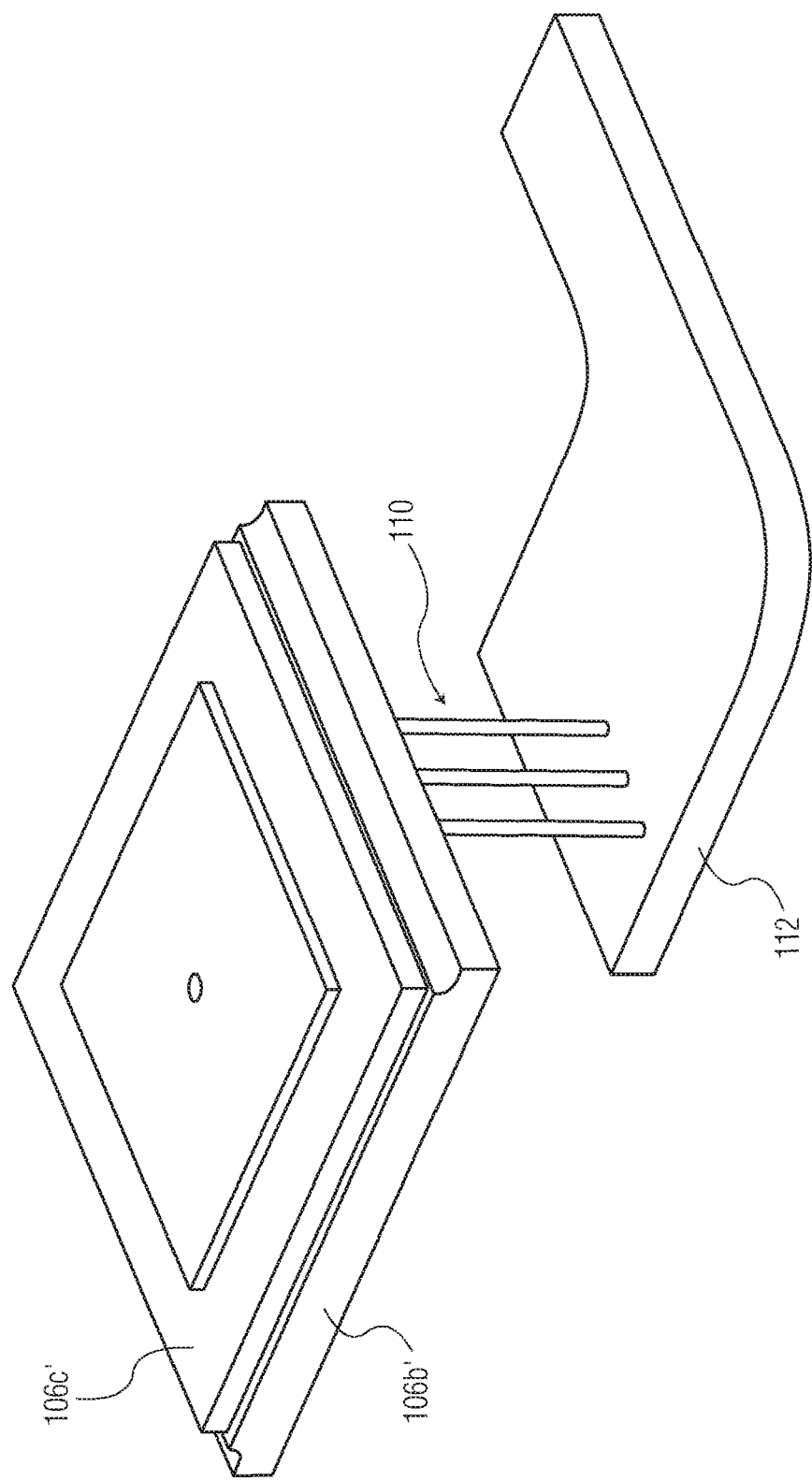

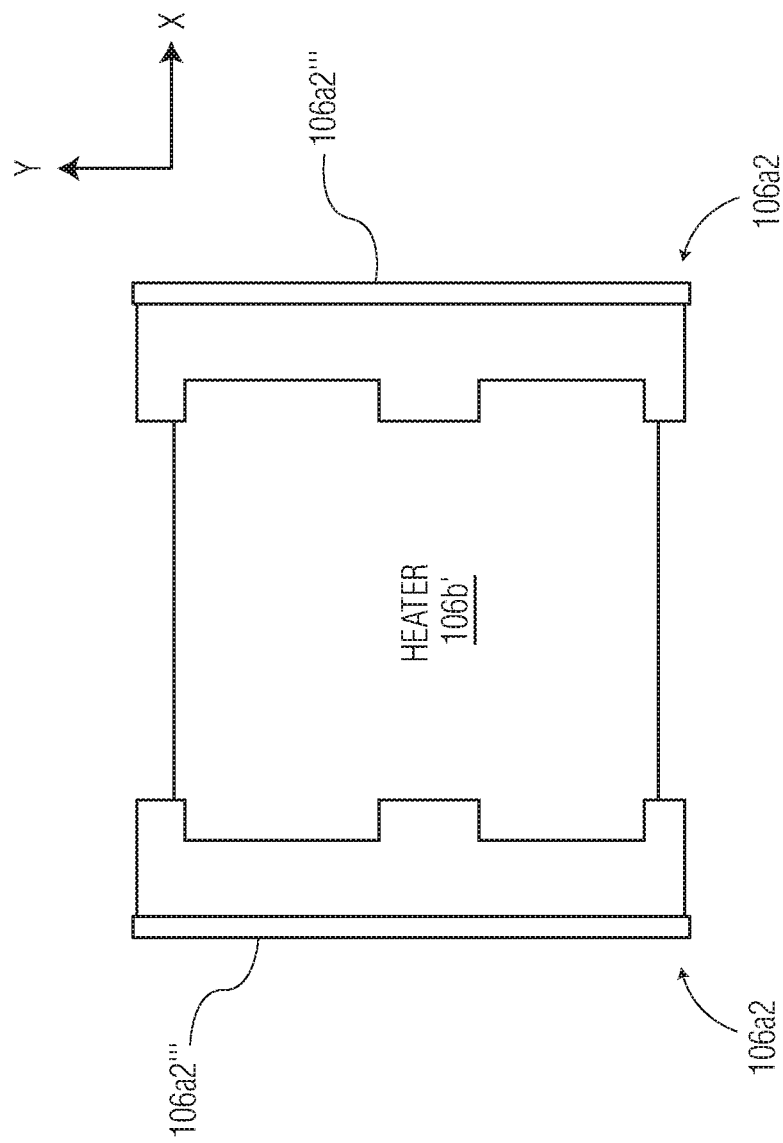

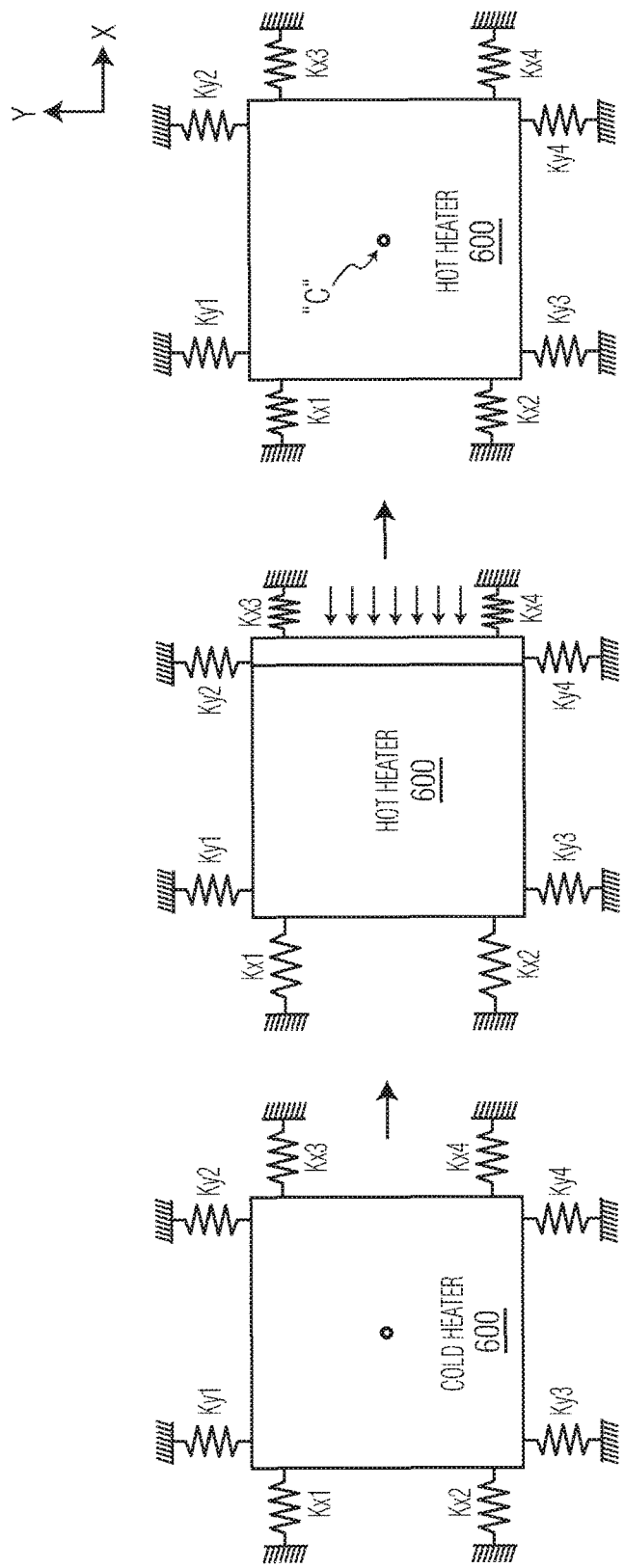

BOND HEAD ASSEMBLIES, THERMOCOMPRESSION BONDING SYSTEMS AND METHODS OF ASSEMBLING AND OPERATING THE SAME

CROSS-REFERENCE TO RELATED APPLICATION

This application is a continuation of U.S. patent application Ser. No. 15/042,620, filed Feb. 12, 2016, which claims the benefit of U.S. Provisional Patent Application No. 62/121,868, filed Feb. 27, 2015, the contents of which is incorporated herein by reference.

FIELD

The invention relates to the formation of electrical interconnections in semiconductor packages, and more particularly, to improved thermocompression bonding systems and methods of operating the same.

BACKGROUND

In certain aspects of the semiconductor packaging industry, semiconductor elements are bonded to bonding locations. For example, in conventional die attach (also known as die bonding) applications, a semiconductor die is bonded to a bonding location of a substrate (e.g., a leadframe, another die in stacked die applications, a spacer, etc.). In advanced packaging applications, semiconductor elements (e.g., bare semiconductor die, packaged semiconductor die, etc.) are bonded to bonding locations of a substrate (e.g., a leadframe, a PCB, a carrier, a semiconductor wafer, a BGA substrate, etc.). Conductive structures (e.g., conductive bumps, contact pads, solder bumps, conductive pillars, copper pillars, etc.) provide electrical interconnection between the semiconductor elements and the bonding locations. In certain applications these conductive structures may provide electrical interconnections analogous to wire loops formed using a wire bonding machine.

In many applications (e.g., thermocompression bonding of semiconductor elements), solder material is included in the conductive structures. In many such processes, heat is applied to the semiconductor element being bonded (e.g., through a heater in a bond head assembly carrying the bond tool). It is important that the application of heat be accomplished quickly such that the machine throughput (e.g., UPH, or units per hour) is at an acceptable level. This can be challenging as the heater (or parts of the heater) is desirably at different temperatures at different times/locations (e.g., a cooler temperature during removal of the component from a source, such as a wafer, as opposed to a warmer temperature at the time of thermocompressive bonding to a substrate).

Unpredictable expansion and contraction of the heater, resulting from heating and cooling of the heater, tends to undesirably affect the placement accuracy in thermocompression bonding applications.

Thus, it would be desirable to provide improved structures and methods for thermocompression bonding to desirably maintain the relative position of a heater during thermocompression bonding processes.

SUMMARY

According to an exemplary embodiment of the invention, a bond head assembly (also referred to as a "bond head" or "bonding head") for bonding a semiconductor element to a substrate is provided. The bond head assembly includes: base structure; a heater; and a clamping system securing the heater to the base structure, the clamping system including a plurality of elastic elements constraining the heater along a plurality of axes.

Various exemplary details related to such a bond head assembly may include: the heater including a contact portion contacting the semiconductor element during a bonding process; the bond head assembly includes a tool secured to the heater, the tool contacting the semiconductor element during a bonding process; the heater is formed of a ceramic material; the elastic elements of the clamping system comprise a material having a coefficient of thermal expansion in a range of between $8\text{-}10 \times 10^{-6}$ per degree Celsius, and a thermal conductivity in a range of between 5-10 Watts/(meter×degree Celsius); the base structure includes an insulating structure having a coefficient of thermal expansion in a range of between $6\text{-}12 \times 10^{-6}$ per degree Celsius, and a thermal conductivity in a range of between 1-3 Watts/(meter×degree Celsius); the base structure defines at least one vacuum channel through which a vacuum is drawn for temporarily securing the semiconductor element to the heater during a bonding process; the base structure defines at least one cooling channel configured to transmit a cooling fluid to the heater; wherein the base structure receives electrical contacts bringing electrical energy to the heater; the plurality of elastic elements includes a plurality of elements constraining the heater along at least one substantially horizontal axis of the bond head assembly; the plurality of elastic elements includes a plurality of elements constraining the heater along a z-axis of the bond head assembly; the clamping system includes two clamping structures arranged on opposite sides of the heater; each of the two clamping structures includes ones of the plurality of elastic elements constraining the heater along a plurality of axes of the bond head assembly; each of the two clamping structures includes ones of the plurality of elastic elements constraining the heater along a substantially horizontal axis of the bond head assembly and a substantially vertical axis of the bond head assembly; each of the two clamping structures is formed from a unitary piece of material; another elastic element is secured to each of the two clamping structures and constrains the heater along another substantially horizontal axis of the bond head assembly; at least a portion of the plurality of elastic elements are preloaded with the heater; the portion of the plurality of elastic elements are preloaded with the heater such that the portion of the preloaded plurality of elastic elements is held in tension; the preloaded portion of the plurality of elastic elements are arranged along a substantially horizontal axis of the bond head assembly; the preloaded portion of the plurality of elastic elements are arranged along a substantially vertical axis of the bond head assembly; and the plurality of elastic elements are configured to maintain the heater in a substantially balanced state along at least one of the plurality of axes of the bond head assembly, such that an elastic force acting on the heater is substantially equal along the at least one axis of the bond head assembly.

According to another exemplary embodiment of the invention, a thermocompression bonder is provided. The thermocompression bonder includes: a semiconductor element supply station including a plurality of semiconductor elements; a bonding station for holding a substrate configured to receive at least one of the semiconductor elements; and a bond head assembly for bonding the at least one semiconductor element to the substrate. The bond head assembly includes a base structure, a heater, and a clamping system for securing the heater to the base structure. The clamping system includes a plurality of elastic elements constraining the heater along a plurality of axes. The bond head assembly of the thermocompression bonder may include any of the various exemplary details recited in the previous paragraph. Further, the thermocompression bonder may include one or more transfer stations (e.g., see transfer station 170 in FIG. 1).

According to yet another exemplary embodiment of the invention, a method of assembling a bond head assembly is provided. The method includes the steps of: securing a heater to a base structure using a clamping system; and constraining the heater along a plurality of axes of the bond head assembly with a plurality of elastic elements of the clamping system.

Various exemplary details related to such a method of assembling a bond head assembly may include: the heater including a contact portion for contacting a semiconductor element during a bonding process; a step of securing a tool to the heater wherein the tool is configured to contact the semiconductor element during a bonding process; the heater being formed of a ceramic material; the plurality of elastic elements of the clamping system comprising titanium; the plurality of elastic elements of the clamping system comprising a material having a coefficient of thermal expansion in a range of between 8-10 ($10\text{-}6/°$ C.), and a thermal conductivity in a range of between 5-10 (W/m•° C.); the base structure including an insulating structure having a coefficient of thermal expansion in a range of between 6-12 ($10\text{-}6/°$ C.), and a thermal conductivity in a range of between 1-3 (W/m•° C.); the base structure defining at least one vacuum channel through which a vacuum is drawn for temporarily securing a semiconductor element to the heater; the base structure defining at least one cooling channel configured to transmit a cooling fluid to the heater; the base structure receiving electrical contacts for bringing electrical energy to the heater; the heater is constrained along at least one substantially horizontal axis with ones of the plurality of elastic elements; the heater being constrained along an x-axis and a y-axis of the bond head assembly with ones of the plurality of elastic elements; the heater being constrained along a z-axis of the bond head assembly with ones of the plurality of elastic elements; the step of arranging two clamping structures of the clamping system on opposite sides of the heater; the heater being constrained along the plurality of axes using ones of the plurality of elastic elements included in each of the two clamping structures; the heater being constrained along a substantially horizontal axis of the bond head assembly and a substantially vertical axis of the bond head assembly using ones of the plurality of elastic elements of each of the two clamping structures; each of the two clamping structures being formed from a unitary piece of material; the step of securing another elastic element to each of the two clamping structures such that the heater is constrained along another substantially horizontal axis of the bond head assembly; the step of preloading at least a portion of the plurality of elastic elements using at least one of the base structure and the heater; the step of arranging the preloaded portion of the plurality of elastic elements along a substantially horizontal axis of the bond head assembly; the step of arranging the preloaded portion of the plurality of elastic elements along a substantially vertical axis of the bond head assembly; the step of preloading at least a portion of the plurality of elastic elements with at least one of the base structure and the heater such that the preloaded portion of the plurality of elastic elements are held in tension; and the step of configuring the plurality of elastic elements to maintain the heater in a substantially balanced state along at least one of the plurality of axes, such that an elastic force acting on the heater is substantially equal along the at least one of the plurality of axes.

According to yet another exemplary embodiment of the invention, a method of operating a bond head assembly of a thermocompression bonding machine is provided. The method includes the steps of: securing a heater to a base structure using a clamping system, the clamping system including a plurality of elastic elements constraining the heater along a plurality of axes; and operating the heater in connection with a thermocompression bonding process.

Various exemplary details related to such a method of operating a bond head assembly may include: heating the heater, thereby expanding the heater in at least one substantially horizontal axis, and maintaining the expanded heater in a position relative to the bond head assembly by constraining the heater along the at least one substantially horizontal axis using the plurality of elastic elements; the at least one substantially horizontal axis including an x-axis and a y-axis of the thermocompression bonding machine; the step of securing the heater to the base structure including constraining the heater with ones of the elastic elements along the x-axis and the y-axis of the thermocompression bonding machine; expansion of the heater in at least one of the x-axis and the y-axis results in substantial equalization of elastic bending in the ones of the elastic elements along the at least one of the x-axis and the y-axis; a position of a center of the heater along the x-axis and the y-axis of the thermocompression bonding machine is substantially maintained during operation of the heater; the step of cooling the heater while maintaining a contact between the heater and the base structure using the clamping system; the contact between the heater and the base structure is maintained by preloading ones of the plurality of elastic elements along a z-axis of the thermocompression bonding machine; the heater includes a contact portion for contacting a semiconductor element during the thermocompression bonding process; the step of securing a tool to the heater wherein the tool is configured to contact the semiconductor element during the thermocompression bonding process; the heater being formed of a ceramic material; the plurality of elastic elements of the clamping system comprising titanium; the plurality of elastic elements of the clamping system comprise a material having a coefficient of thermal expansion in a range of between 8-10 ($10\text{-}6/°$ C.), and a thermal conductivity in a range of between 5-10 (W/m•° C.); the plurality of elastic elements of the clamping system comprising titanium; the plurality of elastic elements of the clamping system comprise a material having a coefficient of thermal expansion in a range of between 8-10 ($10\text{-}6/°$ C.), and a thermal conductivity in a range of between 5-10 (W/m•° C.); the base structure defining at least one vacuum channel through which a vacuum is drawn for temporarily securing a semiconductor element to the heater; the base structure defining at least one cooling channel configured to transmit a cooling fluid to the heater; the base structure receiving electrical contacts for bringing electrical energy to the heater; the heater being constrained along an x-axis and a y-axis of the bond head assembly with ones of the plurality of elastic elements; the heater being constrained along a z-axis of the bond head assembly with ones of the plurality of elastic elements; the step of arranging two clamping structures of the clamping system on opposite sides of the heater; the heater being constrained along the plurality of axes using ones of the plurality of elastic elements included in each of the two clamping structures;

the heater being constrained along a substantially horizontal axis of the bond head assembly and a substantially vertical axis of the bond head assembly using ones of the plurality of elastic elements of each of the two clamping structures; each of the two clamping structures is formed from a unitary piece of material; the step of securing another elastic element to each of the two clamping structures such that the heater is constrained along another substantially horizontal axis of the bond head assembly; the step of preloading at least a portion of the plurality of elastic elements using at least one of the base structure and the heater; the step of arranging the preloaded portion of the plurality of elastic elements along a substantially horizontal axis of the bond head assembly; the step of arranging the preloaded portion of the plurality of elastic elements along a substantially vertical axis of the bond head assembly; the step of preloading at least a portion of the plurality of elastic elements with at least one of the base structure and the heater such that the preloaded portion of the plurality of elastic elements are held in tension; the step of configuring the plurality of elastic elements to maintain the heater in a substantially balanced state along at least one of the plurality of axes, such that an elastic force acting on the heater is substantially equal along the at least one of the plurality of axes; and the at least one axis including at least one of an x-axis and a y-axis of the bond head assembly.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIG. 3D is a block diagram perspective view of a portion of a lower bond head of a thermocompression bonder illustrating electrical connections in accordance with an exemplary embodiment of the invention;

FIGS. 5A-5F are block diagram views illustrating elements of a bond head assembly in accordance with an exemplary embodiment of the invention; and FIGS. 6A-6C are block diagram side views illustrating portions of a bonding machine illustrating elastic elements engaged with a heater in a respective cold state, an intermediate heating state and a hot state in accordance with exemplary embodiments of the invention.

DETAILED DESCRIPTION

Figure 1:
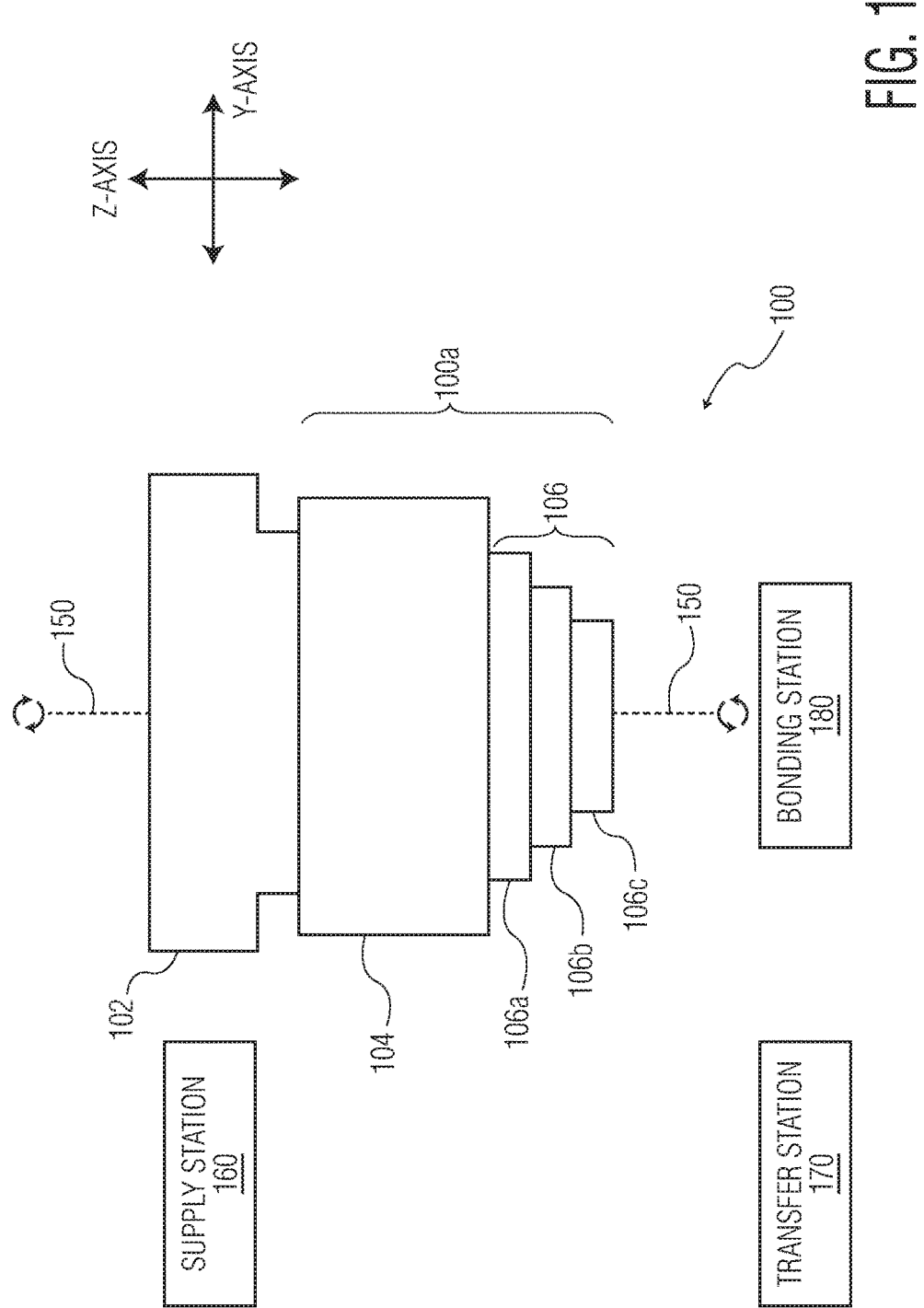
FIG. 1 is a block diagram view of portions of a thermocompression bonder, including a bond head assembly, in accordance with an exemplary embodiment of the invention.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semicondcutor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the terms "substrate" and "workpiece" are intended to refer to any structure to which a semiconductor element may be bonded (e.g., thermocompressively bonded, ultrasonically bonded, thermosonically bonded, die bonded, etc.). Exemplary substrates include, for example, a leadframe, a PCB, a carrier, a semiconductor chip, a semicondcutor wafer, a BGA substrate, a semiconductor element, etc.

Certain exemplary aspects of the invention relate to a bonding head (also referred to as a "bond head" or "bond head assembly") of a die attach machine for performing a local reflow solder die attach process. In such a process, the bonding tool places and bonds a semiconductor element (e.g., a die, an interposer, etc.) to a substrate (e.g., a chip, a wafer, etc.) by melting and re-solidifying solder bumps on the semiconductor element being placed. This process involves the bonding tool rapidly heating and cooling (e.g., a range of 100s of degrees Celsius, at rates of 100s of degrees per second) while desirably maintaining a position of the semiconductor element (e.g., to single digit micron, or smaller, levels).

In accordance with certain aspects of the invention, bonding forces (e.g., forces along the vertical, z-axis) applied to the heater, tool, and semiconductor element being placed/bonded are transferred through a rigid insulating structure. In addition the heater is supported in all other orthogonal directions by balanced elastic elements. Since the constraining elements are desirably balanced, non-symmetric growth will result in the heater being shifted to a correct center position. The z-axis clamping element provides forces such that when pressurized cooling fluid is applied to the non-chip side of the heater the heater does not separate from the supporting structure.

In accordance with certain exemplary aspects of the invention, a design is provided that allows for full support of the heater being constrained. Since thermocompression bonding often requires the rapid change of temperature, it is typically advantageous to reduce the thermal mass of the heater. One such way of reducing thermal mass is to minimize the thickness (while maintaining X,Y dimensions), thus reducing the volume of material required to be heated, which is done in certain aspects of the invention.

In accordance with certain aspects of the invention, bonding systems (e.g., thermocompression bonding systems) utilizing heat in a bond head assembly (e.g., for melting and/or softening a solder material included as part of the interconnects of a semiconductor element to be bonded) are disclosed. A bond tool (which may be distinct from the heater, or which may be part of the heater) carried by the bond head assembly places and bonds a semiconductor element to a substrate by melting and re-solidifying solder bumps on the semiconductor element being placed/bonded. In order to melt the solder bumps, it is desirable to rapidly heat the bond tool (via the integrated, or separate, heater) while maintaining the position of the semiconductor element being bonded (e.g., to single digit micron, or smaller, levels). It is also desirable to be able to rapidly cool the bond tool while maintaining the relative position of the bonding tool. Thus, it is desirable that bonding systems (and related processes) be capable of precise control of the bond tool positioning during all phases of the bonding process (e.g., during the heating phase/process, during the cooling phase/process, etc.).

According to various aspects of the invention, the position of the heater, and thus the bonding tool, may be controlled during the heating phase/process (and the cooling phase/process) of a thermocompression bonding process. For example, according to certain exemplary embodiments of the invention, the heater is restrained by clamping elements that serve to maintain a center of the heater during a heating phase (and a cooling phase). This in turn maintains the relative position of a bonding tool carried by the heater and any semiconductor element retained by the bonding tool. A rigid insulating structure carries the heater and insulates the remainder of the bond head assembly from the heating and cooling of the heater.

When the clamping elements first engage the rigid insulating structure and cold heater, the clamping elements are pre-loaded. When the heater is heated, it expands and increases the load on the pre-loaded clamping elements. The clamping elements may be considered as a series of elastic elements constraining the heater along a plurality of axes. As such, any uneven expansion of the heater as it is heated is compensated for by the series of elastic elements maintaining/returning to substantially neutral positions with equal tension/compression of the elastic elements as will be described below.

FIG. 1 illustrates exemplary thermocompression bonder 100. Bonder 100 includes bond head assembly 100a including upper bond head 104 (driven by motion system 102, for example, along the z-axis and the y-axis) and lower bond head 106. Lower bond head 106 is coupled to upper bond head 104. As such, various motions of upper bond head 104 will result in corresponding motions of lower bond head 106. Such motions may be provided, for example, by motion system 102, and/or a rotary motion about theta axis 150 (with a corresponding motion system not shown), or another motion system (not shown). Lower bond head 106 includes base structure 106a (which desirably includes cooling channels for receiving a fluid for cooling heater 106b during cooling phases of the process), heater 106b, and bonding tool 106c. As will be appreciated by those skilled in the art, heater 106b may be a heated bond tool configured to carry and bond a semiconductor element (not shown in FIG. 1), and as such, a separate bonding tool 106c may be omitted. That is, the terms heater and bond/bonding tool may be used interchangeably, and may be integrated into a single component (as shown in the exemplary embodiment illustrated in FIG. 3A) or may be multiple separate components (as shown in the exemplary embodiments illustrated in FIG. 1, FIGS. 3B-3C). Heater/bonding tool 106b/106c bonds a semiconductor element to a substrate at bonding station 180. In a direct pick and place embodiment, heater/bonding tool 106b/106c may pick a semiconductor element from supply station 160 (e.g., a semiconductor wafer or other structure providing semiconductor elements), and bond the element to a substrate at bonding station 180. In an embodiment using a transfer station (or a plurality of transfer stations if multiple transfers occur), a pick tool (e.g., not shown, but included in transfer station 170) picks a semiconductor element from supply station 160; the semiconductor element is transferred from the pick tool to heater/bonding tool 106b/106c (where such transfer may involve flipping of the semiconductor element), and then the element is bonded to a substrate at bonding station 180.

Figure 2A:
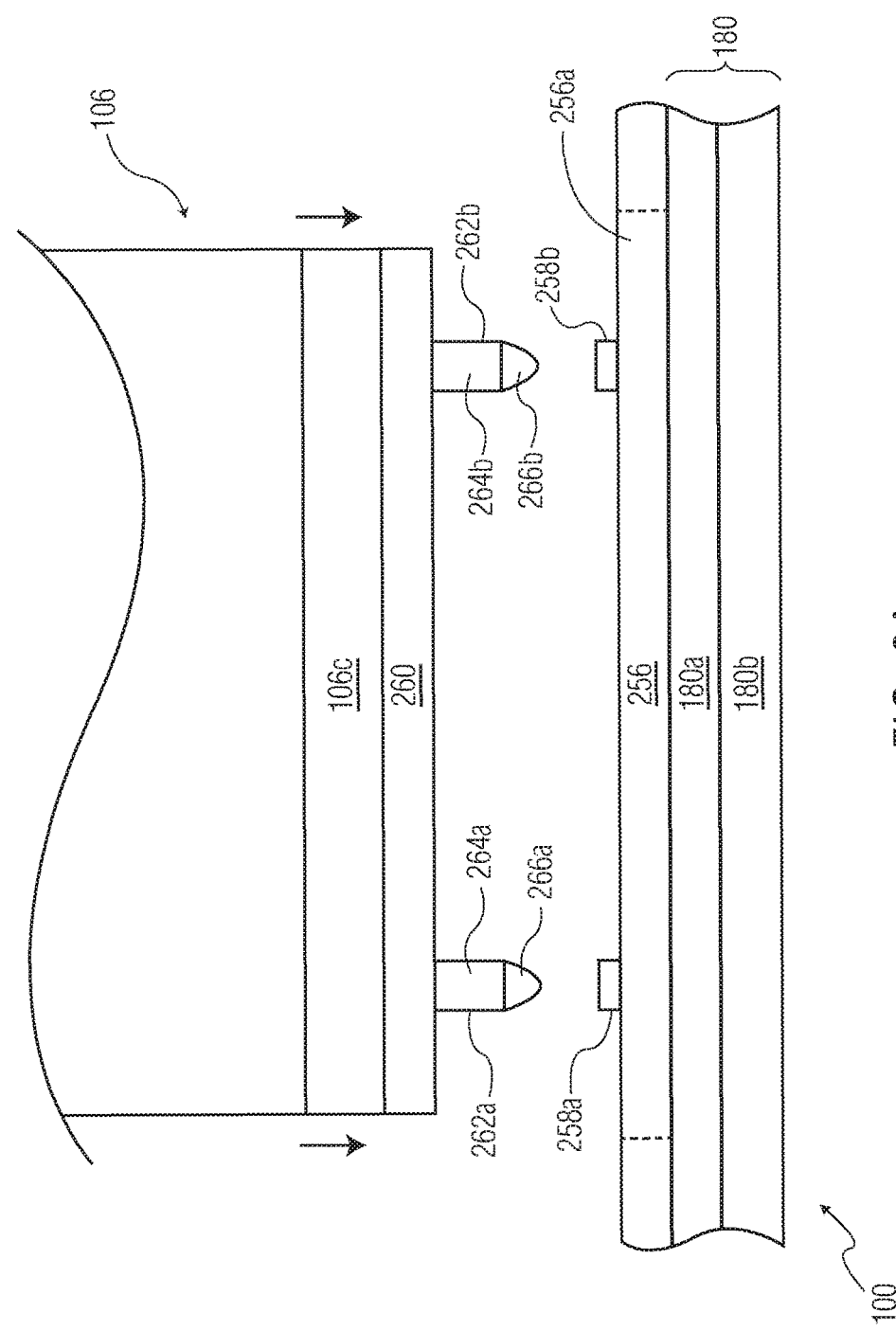
FIGS. 2A-2B are block diagram side sectional views illustrating bonding of a semiconductor element to a substrate using a thermocompression bonder, including a bond head assembly, in accordance with an exemplary embodiment of the invention.
Figure 2B:
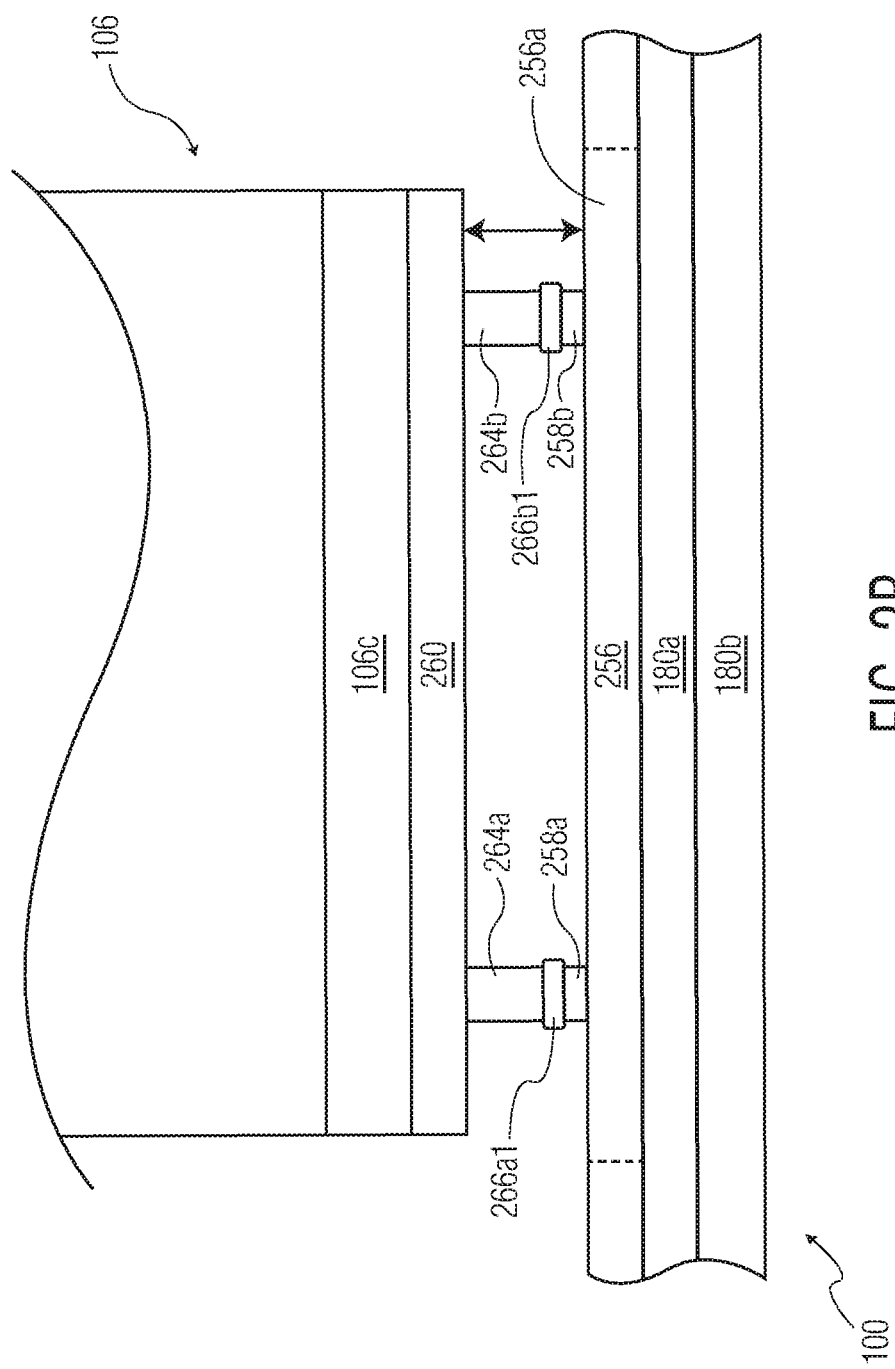

FIG. 2A illustrates thermocompression bonder 100 including bonding tool 106c (included in lower bond head 106) carrying semiconductor element 260 (e.g., a semiconductor die). Upper conductive structures 262a, 262b (e.g., each including respective conductive pillars 264a, 264b such as copper pillars, and corresponding solder contact portions 266a, 266b) are provided on semiconductor element 260. Bonding tool 106c is lowered such that such that upper conductive structures 262a, 262b contact lower conductive structures 258a, 258b on bonding location 256a of substrate 256 (as will be appreciated, a substrate may include a plurality of bonding locations configured to receive a plurality of semicondcutor elements). In the example shown in FIG. 2A, substrate 256 is supported by bonding station 180, where bonding station 180 includes a support structure 180a (e.g., an application specific part) on a bond stage 180b. In FIG. 2B, through a thermocompressive bonding process, solder contact portions 266a, 266b are softened, and then re-solidified as solder interfaces 266a1, 266b1, providing a permanent conductive coupling between ones of conductive structures/pillars 264a, 264b and respective lower conductive structures 258a, 258b. Although FIGS. 2A-2B illustrate only two pairs of conductive structures (pair 262a, 258a and pair 262b, 258b), this is of course a simple example for ease of explanation. In practice, any number of pairs of conductive structures may be provided (e.g., tens of conductive structure pairs, hundreds of conductive structure pairs, etc.).

Figure 3A:
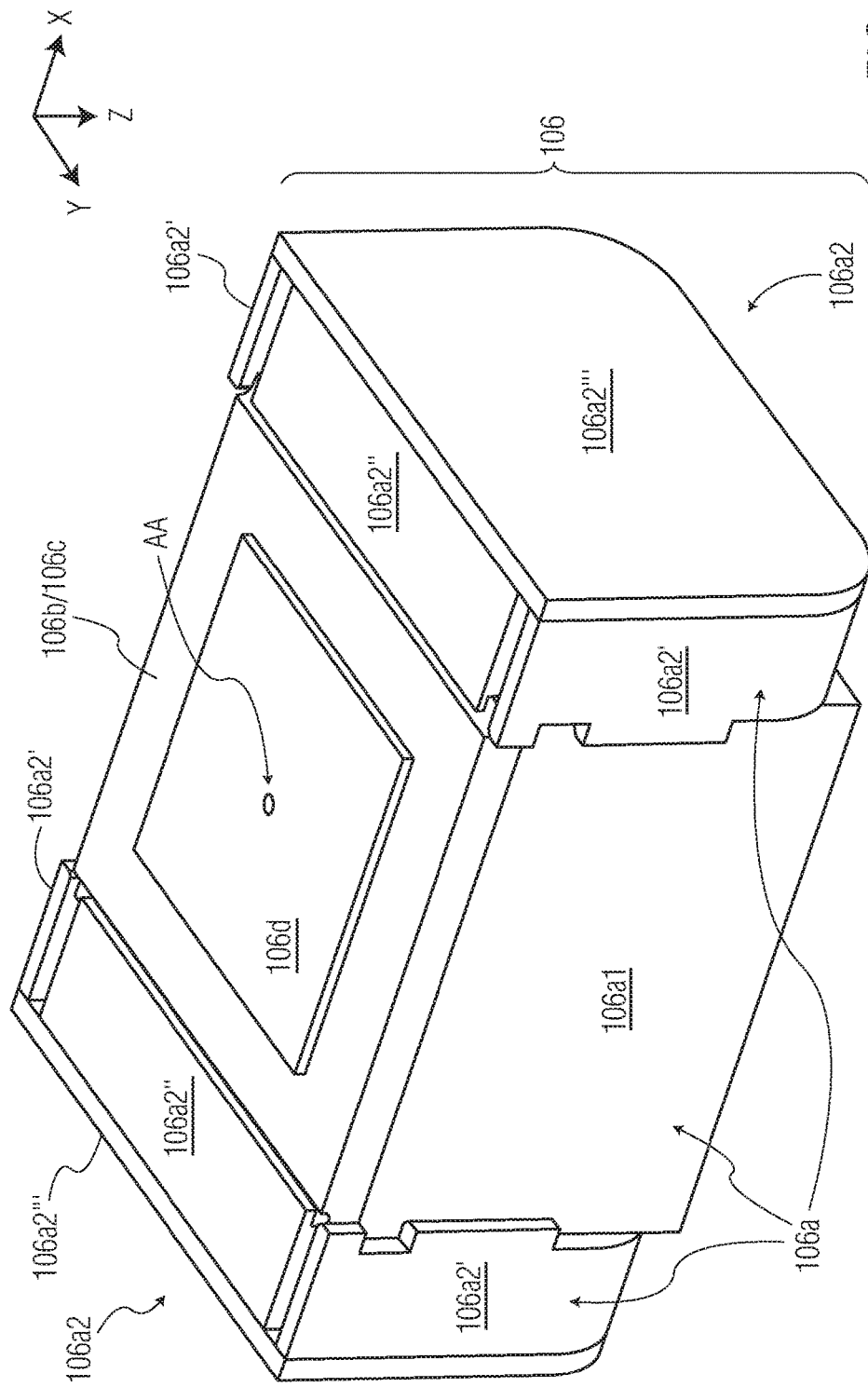
FIG. 3A is a block diagram perspective view of a lower bond head of a thermocompression bonder in accordance with an exemplary embodiment of the invention.

FIG. 3A illustrates details of an exemplary lower bond head 106 (such as lower bond head 106 in FIGS. 1 and 2A-2B). Lower bond head 106 is an example including an integrated heater/bonding tool 106b/106c. Heater/bonding tool 106b/106c includes a raised portion 106d (e.g., a mesa or protrusion) configured to contact a semiconductor element during the thermocompression bonding process. Vacuum hole AA is shown in heater/bonding tool 106b/106c through which vacuum may be used to secure the semiconductor element during movement to the bonding location. Lower bond head 106 also includes a holding structure 106a for holding (constraining) heater/bonding tool 106b/106c. Holding structure 106a includes base structure 106a1 which may be an insulative body portion (as such, base structure 106a1 may be referred to as insulative body portion 106a1). Base structure 106a1 defines at least one cooling channel configured to transmit a cooling fluid to the heater. Holding structure 106a also includes two sets of clamping structures 106a2 (positioned on opposite sides of insulative body portion 106a1) for holding heater/bonding tool 106b/106c to insulative body portion 106a1. Clamping structures 106a2 each include a plurality of elastic elements (e.g., flexures formed from titanium or an alloy thereof capable of handling the thermocompression process variables such as temperature changes without losing its properties of elasticity, etc.). In the embodiment shown in FIG. 3A, each clamping structure 106a2 includes (1) a structure including two elastic elements 106a2' (side elastic elements) and flexure 106a2" (top elastic element) (where all three elastic elements 106a2', 106a2' and 106a2" may be formed from a single piece of material), and (2) an elastic backing plate 106a2'''. Collectively, the two backing plates 106a2''' provide elastic constraint along the x-axis (e.g., as the heater grows and contracts). The two pairs of elastic elements 106a2' (4 elastic elements) collectively provide elastic constraint along the y-axis (e.g., as the heater grows and contracts). Collectively, the two elastic elements 106a2" provide elastic constraint along the z-axis (e.g., as the heater grows and contracts). For example, each of the two elastic elements 106a2" defines a plurality of grooves in the titanium structure to provide such elastic constraint along the z-axis.

Through the use of the two clamping structures 106a2, elastic constraint is provided for the heater along each of the x, y, and z-axes, thereby allowing the heater to expand (and contract) substantially centered with respect to its cold (original position).

Figure 3B:
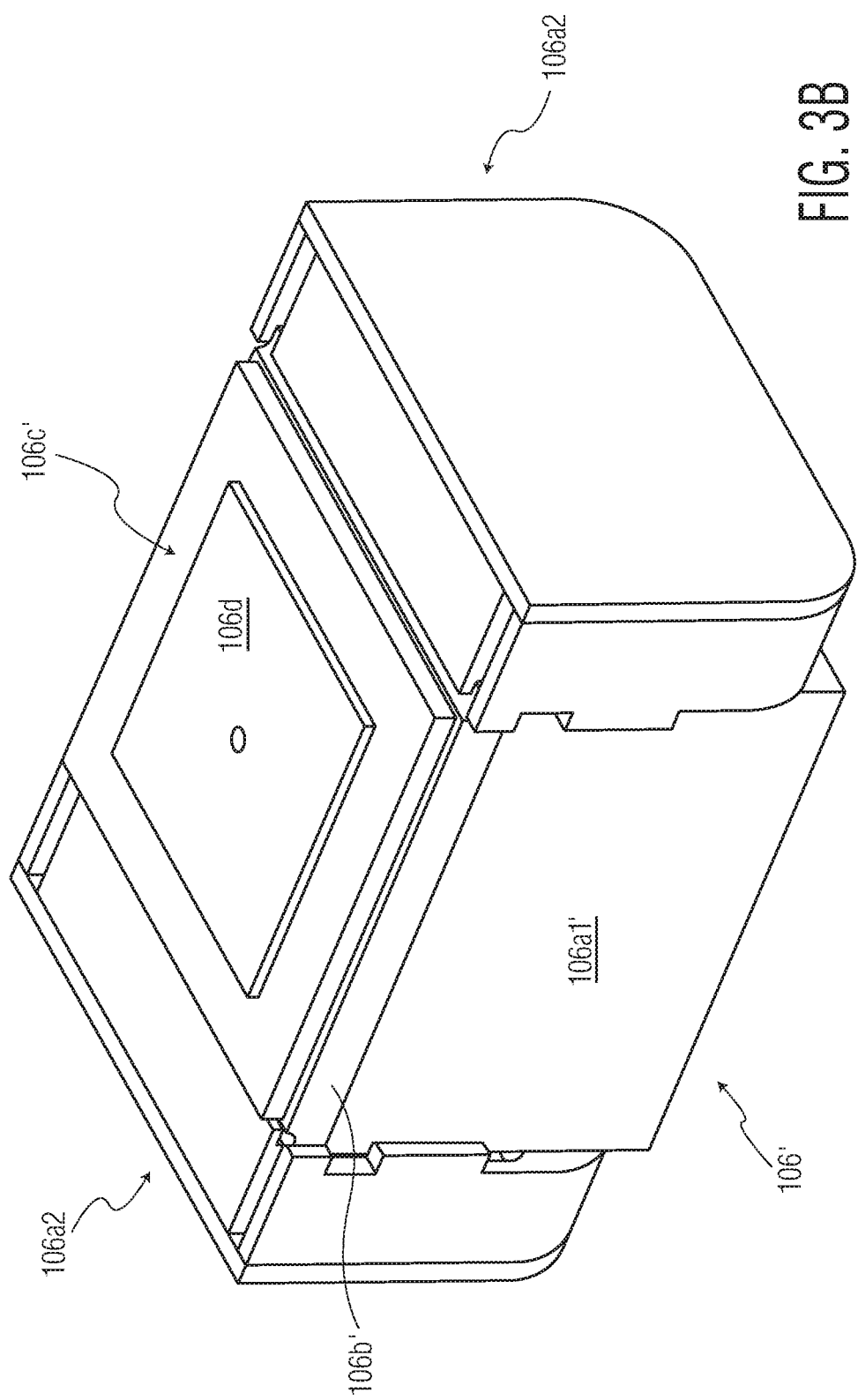
FIGS. 3B-3C are block diagram perspective views of another lower bond head of a thermocompression bonder in accordance with another exemplary embodiment of the invention.
Figure 3C:
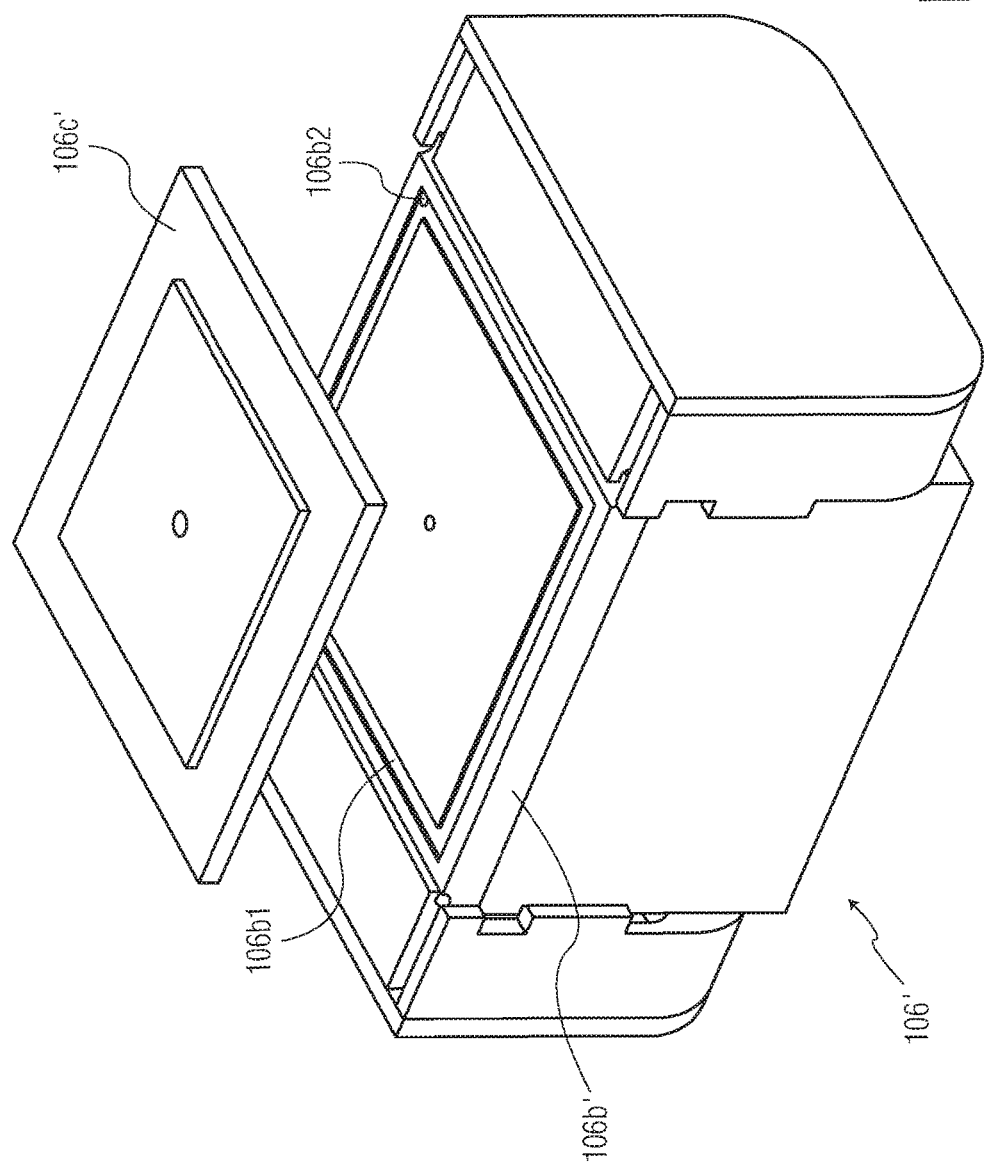

FIGS. 3B-3C illustrates lower bond head 106' (where lower bond head 106' may take the place of lower bond head 106 in FIGS. 1 and 2A-2B) in an example configuration including a heater 106b' and a bonding tool 106c' that are distinct from one another. In FIG. 3B, the bonding tool 106c' is engaged with heater 106b', where a vaccum channel 106b1 (e.g., a lip, a groove, a recess, etc. such as shown in FIG. 3C) is provided with vacuum from vacuum opening 106b2. FIG. 3C illustrates bonding tool 106c' removed from heater 106b' for illustration. Base structure 106a1 is similar to base structure 106a1 in FIG. 3A, except that it defines a vacuum channel as in FIG. 3F). Otherwise, the elements of FIGS. 3B-3C (including the clamping structures 106a2) are the same as in FIG. 3A.

FIG. 3D illustrates heater 106b' and bonding tool 106c' (with the remainder of lower bond head 106' removed for clarity, but illustrating electrical contacts/connections 110 (connected to PCB 112) which provide electricity for heating heater 106b' (and to carry other electrical signals, such as temperature sensor feedback signals).

Figure 3E:
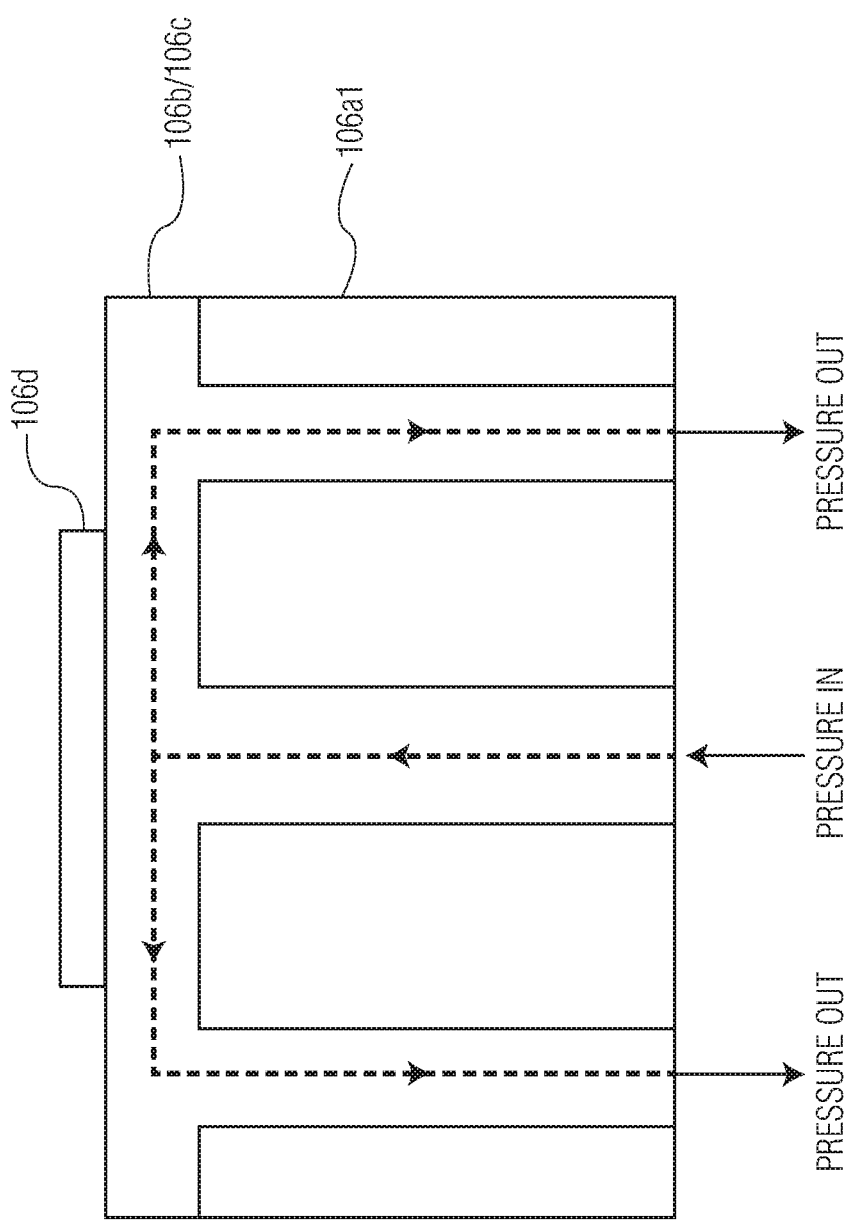
FIGS. 3E-3F are block diagram side sectional views of a portion of a lower bond head of a thermocompression bonder illustrating fluid flow paths in accordance with an exemplary embodiment of the invention.

FIG. 3E illustrates an example with the heater/tool integrated into a single structure. Base structure 106a1 defines a plurality of channels for receiving and distributing cooling fluid for cooling heater 106b/106c (including raised portion 106d of heater 106b/106c) during a cooling phase. FIG. 3E illustrates exemplary cooling fluid paths. It will be appreciated these the cooling paths may vary significantly from those shown. Although the cooling paths are shown as including a portion of heater/tool 106b/106c, it is understood that the cooling paths may be included entirely within base structure 106a1, where the cooling is provided through contact between base structure 106a1 and heater/tool 106b/106c.

Figure 3F:
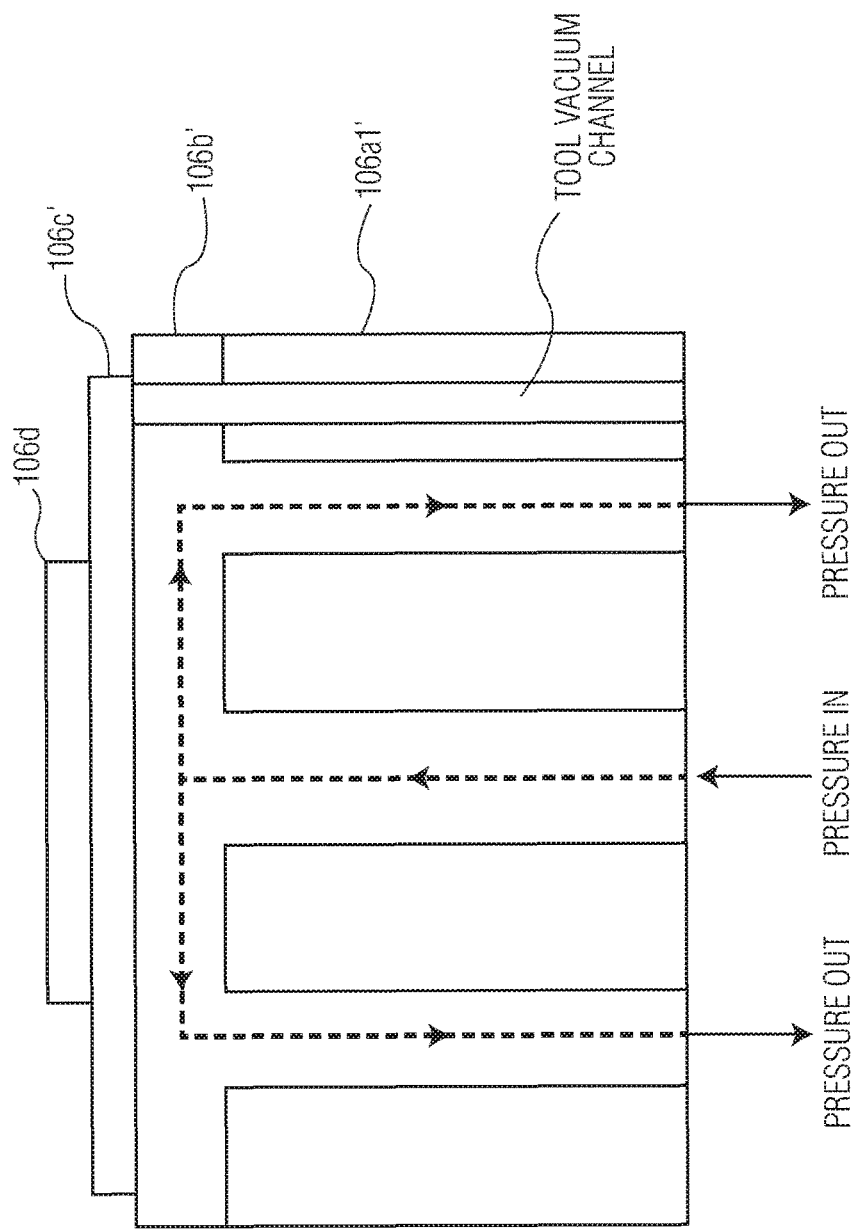

FIG. 3F illustrates an example with the heater and tool provided as distinct structures. As in FIG. 3E, base structure 106a1' defines a plurality of channels for receiving and distributing cooling fluid for cooling heater 106b' during a cooling phase. FIG. 3F illustrates exemplary cooling fluid paths. FIG. 3F also illustrates a tool vaccum channel for holding tool 106c' (including raised portion 106d) to heater 106b' using vacuum. Although the cooling paths are shown as including a portion of heater 106b', it is understood that the cooling paths may be included entirely within base structure 106a1', where the cooling is provided through contact between base structure 106a1' and heater 106b'.

Figure 4B:
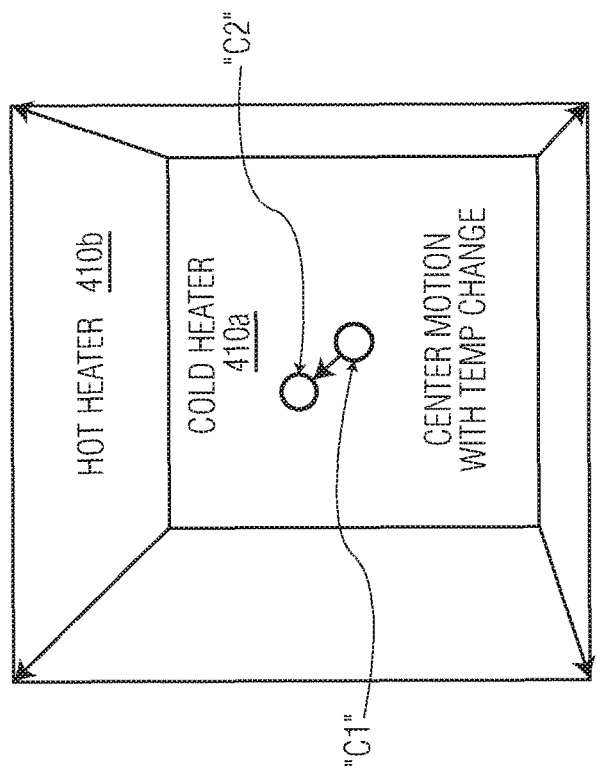
FIG. 4A-4B are block diagram overhead views of portions of heater elements of a thermocompression bonder illustrating relative expansion displacement of each heater in accordance with an exemplary embodiment of the invention.
Figure 4A:
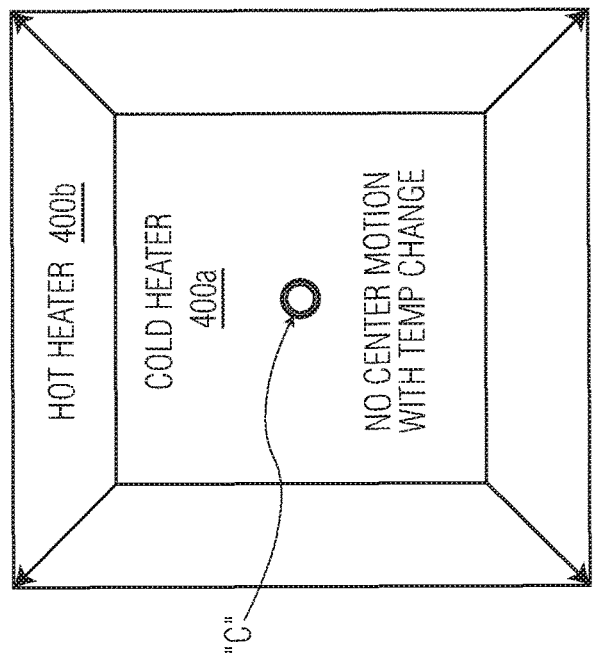

FIG. 4A is an overhead block diagram view of parts of a thermocompression bonder including a heater in a cold state (400a) and an expanded hot state (400b), where the teachings of FIGS. 4A-4B may be applied to any heater (e.g., heater/tool 106b/106c, heater 106b', etc.) in accordance with the invention. The center points "C" of the cold heater 400a and the hot heater 400b coincide, and thus FIG. 4A illustrates an idealized heater expansion with no motion of the center point. Thus, stress exerted at each of the four corners of the cold heater 400a (illustrated as 4 arrows in FIG. 4A) while expanding during the heating process are substantially equal. However, and as illustrated in FIG. 4B, when cold heater 400a is heated, it may expand unevenly so that center point "C2" of the hot heater 400b shifts away from center point "C1" of the cold heater 400a. Thus, stress exerted at each corner of the cold heater 400a while expanding during the heating process are unequal. This uneven expansion of the hot heater 400b also shifts a bonding tool carried by hot heater 400b (or integrated with the heater) and thus any semiconductor element held by the tool. This results in an unacceptable movement of the semiconductor element in relation to a work piece to which the semiconductor element may be bonded, and may result in a fatal defect in the bonded semiconductor assembly.

Figure 5B:
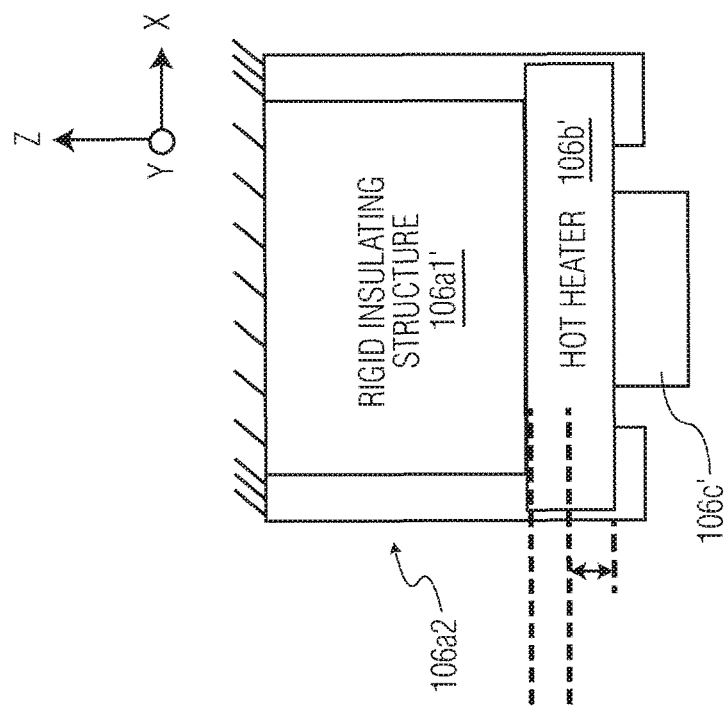
Figure 5A:
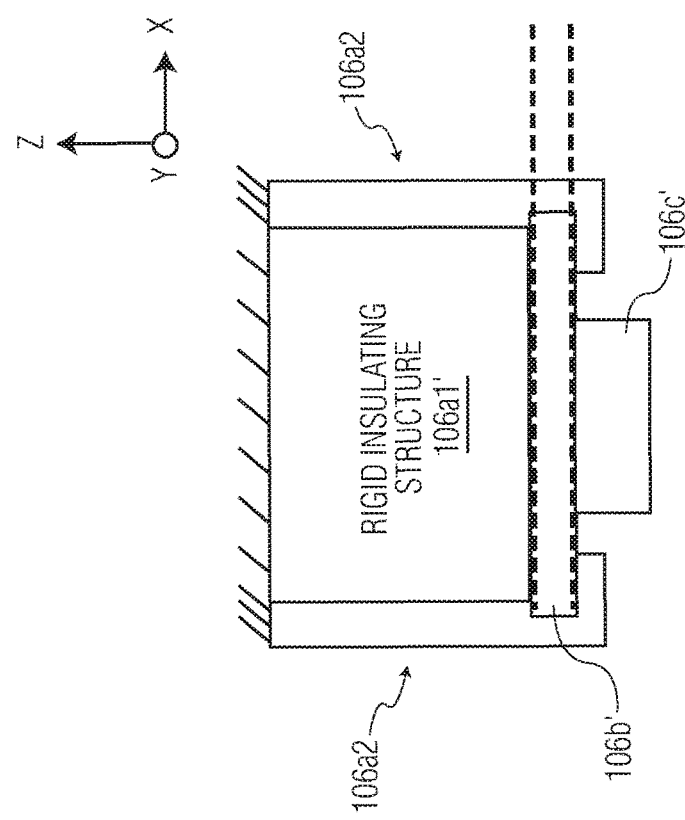
Figure 5E:
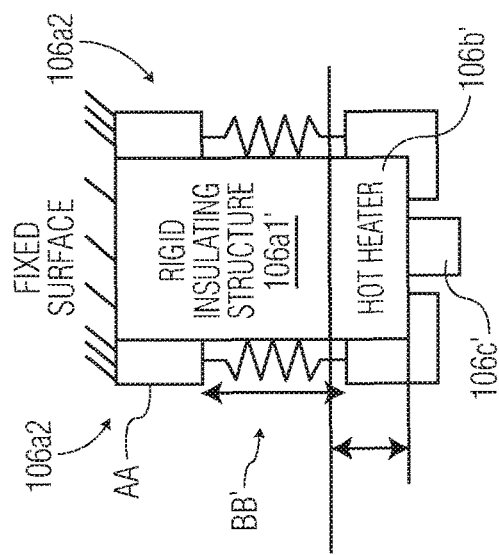
Figure 5D:
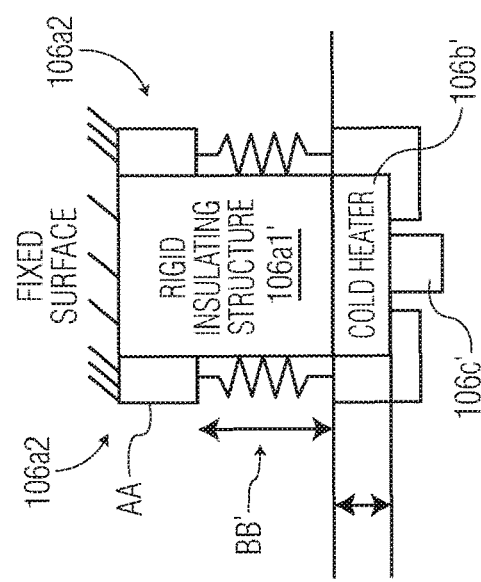
Figure 5C:
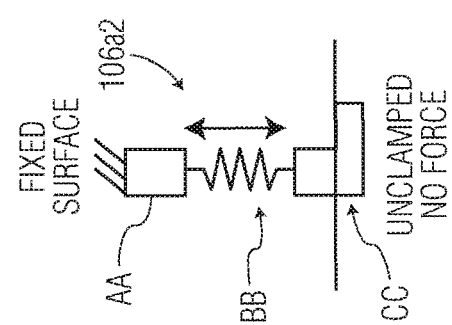

FIG. 5A illustrates block diagram portions of thermocompression bonder 100 (e.g., a thermocompression flip chip bonding machine), such as including lower bond head 106' shown in FIGS. 3B-3C, including clamping structures 106a2 (including the various clamping elements) on each side of a rigid insulating structure 106a1' and heater 106b'. Heater 106b' is cold and carries (cold) bond tool 106c', which in turn may carry a semiconductor element (not shown) for bonding to a substrate (not shown). FIG. 5C illustrates a clamping structure 106a2 in an unclamped, unloaded state, before engaging/clamping rigid insulating structure 106a1 and heater 106b'. One end/portion "AA" of each clamping element structure 106a2 is carried by a fixed surface (e.g., a portion of the bond head assembly), and is separated from an opposing end "CC" of the clamping structure 106a2 by elastic portion "BB" represented in FIG. 5C as a spring structure. The opposing end "CC" of each clamping structure 106a2 has an L-shape configured to engage a lower end of heater 106b'. When the clamping structures 106a2 engage the insulating structure 106a1 and the cold heater 106b' (in a preloaded state, as in FIG. 5D), elastic portion "BB" stretches to tension/load the clamping structures 106a2 as indicated by the double headed arrow in FIG. 5D (see BB') so that the elastic portion is under tension. The loading of the clamping structures 106a2 creates a relatively large force.

FIG. 5B illustrates heater 106b' having been heated to expand in X, Y and Z directions (see the legends). This expansion of heater 106b' is opposed by the loaded clamping system (including the pair of clamping structures 106a2), and creates further loaded clamping elements. The increase in force generated by the heating of heater 106b' is less than the preload force (in FIG. 5D). In FIG. 5D, the preload displacement (along the z-axis) is large compared to additional z-axis displacement in due to heating in FIG. 5E. The construction of clamping system (including the clamping structures 106a2) substantially maintains the center of hot heater 106b' (carrying the heated tool) relative to the center of the cold heater 106b'.

FIG. 5F is a bottom view of FIG. 5A (with the tool removed). Pre-loaded clamping structures 106a2 extend along opposing sides of the cold heater 106b', where backing plates 106a2''' (not shown in FIGS. 5A-5E for simplicity, but see FIGS. 3A-3C) overlie the opposing outer sides of the loaded clamping structures 106a2. Backing plates 106a2''' serve to provide elastic constraint along the x-axis. The loaded clamping structures 106a2 include projections to engage and retain the heater 106b' along a bottom surface (with the upper surface of the heater 106b' being against a fixed surface, such as a part of the bond head assembly).

As will be appreciated by those skilled in the art, the teachings of FIGS. 5A-5F may be applied to any embodiment of the invention. For example, clamping structures 106a2 may be the same as shown in the other drawings, etc.

FIGS. 6A-6C illustrate top down block diagram views of a cold heater 600 (FIG. 6A), the heating of cold heater 600 (FIG. 6B), and a hot heater 600 (FIG. 6C), where the teachings of FIGS. 6A-6C may be applied to any heater (e.g., heater/tool 106b/106c, heater 106b', etc.) in accordance with the invention. The elastic members of the clamping structures/elements/backplates are simplified as spring member pairs Ky1, Ky3; Ky2, Ky4/Kx1, Kx3; and Kx2, Kx4; however, it is understood that the other clamping systems (e.g., such as the previously illustrated and described clamping structures 106a2 may provide the function of the spring member pairs shown in FIGS. 6A-6C). FIG. 6A illustrates cold heater 600 with equal tension/compression of spring member pairs Ky1, Ky3; Ky2, Ky4/Kx1, Kx3; Kx2, Kx4. FIG. 6B illustrates the heater 600 during the process of being heated. As illustrated, the heater 600 expands to the right in relation to FIGS. 6A-6C towards springs Kx3, Kx4: compressing springs Kx3, Kx4; elongating springs Kx1, Kx2; and bending springs Ky1, Ky2; Ky3, Ky4 towards the right. Elastic members/springs tend to balance out the tension/compression/bending in all elastic members/springs. As illustrated in FIG. 6C, center "C" of the unequally expanded hot heater 600 returns (may be maintained) to the same relative position as center "C" of the cold heater 600 (in FIG. 6A). This ensures a bonding tool carried by the heater 600 (or integrated with the heater), and any semiconductor element retained by bonding tool, remain substantially centered.

Although the invention provides specific examples of clamping systems/structures (and associated elastic elements) for elastically constraining the heater along certain axes, it is understood that these examples are non-limiting. That is, various changes may be made to the structure of the clamping structures (including how elastic constraint is provided along each of the x, y, and z-axes) within the scope of the invention. As a specific example, the backing plate provided for elastic constraint along the x-axis could be done in other ways without a backing plate, for example, through further spring function integrated into the clamping elements.

Although certain aspects of the invention have been illustrated with certain motion axes, it is understood that these are exemplary in nature.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bond head assembly for bonding a semiconductor element to a substrate, the bond head assembly comprising:
   a base structure;
   a heater; and
   a clamping system securing the heater to the base structure, the clamping system including a plurality of elastic elements constraining the heater along a plurality of axes,
   the plurality of elastic elements maintaining a center of the heater with respect to at least one of the plurality of axes during (i) a heating phase of a thermocompression bonding process and (ii) a cooling phase of the thermocompression bonding process.

2. The bond head assembly of claim 1 wherein the heater includes a contact portion contacting the semiconductor element during a bonding process.

3. The bond head assembly of claim 1 wherein the bond head assembly includes a tool secured to the heater, the tool contacting the semiconductor element during a bonding process.

4. The bond head assembly of claim 1 wherein the heater is formed of a ceramic material.

5. The bond head assembly of claim 1 wherein the elastic elements of the clamping system comprise titanium.

6. The bond head assembly of claim 1 wherein the elastic elements of the clamping system comprise a material having a coefficient of thermal expansion in a range of between $8\text{-}10\times10^{-6}$ per degree Celsius, and a thermal conductivity in a range of between 5-10 Watts/(meter×degree Celsius).

7. The bond head assembly of claim 1 wherein the base structure includes an insulating structure having a coefficient of thermal expansion in a range of between $6\text{-}12\times10^{-6}$ per degree Celsius, and a thermal conductivity in a range of between 1-3 Watts/(meter×degree Celsius).

8. The bond head assembly of claim 1 wherein the base structure defines at least one vacuum channel through which a vacuum is drawn for temporarily securing the semiconductor element to the heater during a bonding process.

9. The bond head assembly of claim 1 wherein the base structure defines at least one cooling channel configured to transmit a cooling fluid to the heater.

10. The bond head assembly of claim 1 wherein the base structure receives electrical contacts bringing electrical energy to the heater.

11. The bond head assembly of claim 1 wherein the plurality of elastic elements includes a plurality of elements constraining the heater along at least one substantially horizontal axis of the bond head assembly.

12. The bond head assembly of claim 1 wherein the plurality of elastic elements includes a plurality of elements constraining the heater along an x-axis of the bond head assembly and a y-axis of the bond head assembly.

13. The bond head assembly of claim 1 wherein the plurality of elastic elements includes a plurality of elements constraining the heater along a z-axis of the bond head assembly.

14. The bond head assembly of claim 1 wherein the clamping system includes two clamping structures arranged on opposite sides of the heater.

15. The bond head assembly of claim 14 wherein each of the two clamping structures includes ones of the plurality of elastic elements constraining the heater along a plurality of axes of the bond head assembly.

16. The bond head assembly of claim 14 wherein each of the two clamping structures includes ones of the plurality of elastic elements constraining the heater along a substantially horizontal axis of the bond head assembly and a substantially vertical axis of the bond head assembly.

17. The bond head assembly of claim 16 wherein each of the two clamping structures is formed from a unitary piece of material.

18. The bond head assembly of claim 16 wherein another elastic element is secured to each of the two clamping structures and constrains the heater along another substantially horizontal axis of the bond head assembly.

19. The bond head assembly of claim 1 wherein at least a portion of the plurality of elastic elements are preloaded with the heater.

20. The bond head assembly of claim 19 wherein the portion of the plurality of elastic elements are preloaded with the heater such that the portion of the preloaded plurality of elastic elements is held in tension.

21. The bond head assembly of claim 19 wherein the preloaded portion of the plurality of elastic elements are arranged along a substantially horizontal axis of the bond head assembly.

22. The bond head assembly of claim 19 wherein the preloaded portion of the plurality of elastic elements are arranged along a substantially vertical axis of the bond head assembly.

23. The bond head assembly of claim 1 wherein the at least one axis includes at least one of an x-axis of the bond head assembly and a y-axis of the bond head assembly.

24. A thermocompression bonder comprising:
a semiconductor element supply station including a plurality of semiconductor elements;
a bonding station for holding a substrate configured to receive at least one of the semiconductor elements; and
a bond head assembly for bonding the at least one semiconductor element to the substrate, the bond head assembly including a base structure, a heater, and a clamping system for securing the heater to the base structure, the clamping system including a plurality of elastic elements constraining the heater along a plurality of axes,
the plurality of elastic elements maintaining a center of the heater with respect to at least one of the plurality of axes during (i) a heating phase of a thermocompression bonding process and (ii) a cooling phase of the thermocompression bonding process.

25. A method of assembling a bond head assembly, the method comprising the steps of:
securing a heater to a base structure using a clamping system;
constraining the heater along a plurality of axes of the bond head assembly with a plurality of elastic elements of the clamping system; and
using the plurality of elastic elements maintain a center of the heater with respect to at least one of the plurality of axes during (i) a heating phase of a thermocompression bonding process and (ii) a cooling phase of the thermocompression bonding process.

26. A method of operating a bond head assembly of a thermocompression bonding machine, the method comprising the steps of:
securing a heater to a base structure using a clamping system, the clamping system including a plurality of elastic elements constraining the heater along a plurality of axes;
operating the heater in connection with a thermocompression bonding process; and
using the plurality of elastic elements maintain a center of the heater with respect to at least one of the plurality of axes during (i) a heating phase of a thermocompression bonding process and (ii) a cooling phase of the thermocompression bonding process.

* * * * *